United States Patent [19]
Lee et al.

[11] Patent Number: 6,141,191
[45] Date of Patent: Oct. 31, 2000

[54] SPIN VALVES WITH ENHANCED GMR AND THERMAL STABILITY

[75] Inventors: Wen Yaung Lee, San Jose; Tsann Lin, Saratoga; Daniele Mauri, San Jose; Robert John Wilson, Saratoga, all of Calif.

[73] Assignee: International Business Machines Corporation, Armonk, N.Y.

[21] Appl. No.: 08/986,311

[22] Filed: Dec. 5, 1997

[51] Int. Cl.[7] ........................................ G11B 5/39
[52] U.S. Cl. ........................................ 360/324.1
[58] Field of Search ................. 360/113; 338/32 R; 324/207.21, 252; 428/328–329, 693, 701, 900

[56] References Cited

U.S. PATENT DOCUMENTS

| | | | |
|---|---|---|---|
| 5,206,590 | 4/1993 | Dieny et al. | 324/252 |
| 5,465,185 | 11/1995 | Heim et al. | 360/113 |
| 5,528,440 | 6/1996 | Fontana et al. | 360/113 |
| 5,583,725 | 12/1996 | Coffey et al. | 360/113 |
| 5,637,235 | 6/1997 | Kim et al. | 216/22 |
| 5,666,248 | 9/1997 | Gill | 360/113 |
| 5,731,936 | 3/1998 | Lee et al. | 360/113 |
| 5,850,323 | 12/1998 | Kanai | 360/113 |

*Primary Examiner*—George J. Letscher
*Attorney, Agent, or Firm*—William D. Gill

[57] ABSTRACT

An SV sensor with the preferred structure Substrate/Seed/Free/Spacer/Pinned/AFM/Cap where the seed layer is a non-magnetic Ni—Fe—Cr or Ni—Cr film and the AFM layer is preferably Ni—Mn. The non-magnetic Ni—Fe—Cr seed layer results in improved grain structure in the deposited layers enhancing the GMR coefficients and the thermal stability of the SV sensors. The improved thermal stability enables use of Ni—Mn with its high blocking temperature and strong pinning field as the AFM layer material without SV sensor performance degradation from the high temperature anneal step needed to develop the desired exchange coupling.

26 Claims, 6 Drawing Sheets

SPIN VALVES WITH ENHANCED GMR AND THERMAL STABILITY

BACKGROUND OF THE INVENTION

1. Field of the Invention

This invention relates generally to spin valve magnetic transducers for reading information signals from a magnetic medium and, in particular, to a spin valve sensor with enhanced GMR effect and improved thermal stability.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flow through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., Ni—Fe) separated by a layer of non-magnetic material (e.g., copper) are generally referred to as spin valve (SV) sensors manifesting the SV effect. In an SV sensor, one of the ferromagnetic layers, referred to as the pinned layer, has its magnetization typically pinned by exchange coupling with an antiferromagnetic (e.g., NiO or Fe—Mn) layer. The pinning field generated by the antiferromagnetic layer should be greater than demagnetizing fields (about 200 Oe) at the operating temperature of the SV sensor (about 120 C.) to ensure that the magnetization direction of the pinned layer remains fixed during the application of external fields (e.g., fields from bits recorded on the disk). The magnetization of the other ferromagnetic layer, referred to as the free layer, however, is not fixed and is free to rotate in response to the field from the recorded magnetic medium (the signal field). In the SV sensor, the SV effect varies as the cosine of the angle between the magnetization of the pinned layer and the magnetization of the free layer. Recorded data can be read from a magnetic medium because the external magnetic field from the recorded magnetic medium (the signal field) causes a change in direction of magnetization in the free layer, which in turn causes a change in resistance of the SV sensor and a corresponding change in the sensed current or voltage. IBM's U.S. Pat. No. 5,206,590 granted to Dieny et al., incorporated herein by reference, discloses an GMR sensor operating on the basis of the SV effect.

FIG. 1 shows a prior art SV sensor 100 comprising end regions 104 and 106 separated by a central region 102. A free layer (free ferromagnetic layer) 110 is separated from a pinned layer (pinned ferromagnetic layer) 120 by a non-magnetic, electrically-conducting spacer 115. The magnetization of the pinned layer 120 is fixed by an antiferromagnetic (AFM) layer 125. Free layer 110, spacer 115, pinned layer 120 and the AFM layer 125 are all formed in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current $I_S$ from a current source 160 to the MR sensor 100. Sensing means 170 connected to leads 140 and 145 sense the change in the resistance due to changes induced in the free layer 110 by the external magnetic field (e.g., field generated by a data bit stored on a disk).

As mentioned above, the magnetization of the pinned layer 120 in the prior art SV sensor 100 is generally fixed through exchange coupling with AFM layer 125 of antiferromagnetic material such as Fe—Mn or NiO. However, both Fe—Mn and NiO have rather low blocking temperatures (blocking temperature is the temperature at which the pinning field for a given material reaches zero Oe) which make their use as an AFM layer in an SV sensor difficult and undesirable.

A desirable alternate AFM material is Ni—Mn which has better corrosion properties than Fe—Mn, very large exchange pinning at room temperature, and much higher blocking temperature than either Fe—Mn or NiO. High blocking temperature is essential for SV sensor reliability since SV sensor operating temperatures can exceed 120 C. in some applications.

Referring to FIG. 2, there is shown the change in the unidirectional anisotropy field ($H_{UA}$) or pinning field versus temperature for 50 A thick Ni—Fe pinned layers using Fe—Mn, NiO and Ni—Mn as the pinning layers. Fe—Mn has a blocking temperature of about 180 C. (curve 210) and NiO has a blocking temperature of about 220 C. (curve 220). Considering that a typical SV sensor used in a magnetic recording disk drive should be able to operate reliably at a constant temperature of about 120 C. with a pinning field of at least 200 Oe, it can readily be seen that Fe—Mn substantially loses it ability to pin the pinned layer at about 120 C. (pinning field dropping to about 150 Oe) and NiO can only marginally provide adequate pinning at about 120 C. (pinning field dropping to about 170 Oe). It should be noted that once the pinning effect is lost, the SV sensor loses its SV effect either totally or partially, rendering the SV sensor useless. In contrast, it can be seen in FIG. 2 that Ni—Mn with a blocking temperature of beyond 450 C. (curve 230) easily meets the pinning field requirements at the 120 C. operating temperature of typical SV sensors.

However, the problem with using Ni—Mn AFM for the pinning layer is the requirement for a high temperature (equal or greater than 240 C.) annealing step after the deposition of the SV sensor layers (post-annealing) to achieve the desired exchange coupling between the Ni—Mn pinning layer and the Ni—Fe pinned layer in order to achieve proper SV sensor operation. Unfortunately, annealing at such high temperature (equal or greater than 240 C.) substantially degrades the GMR coefficient of the SV sensor. This irreversible degradation of the SV sensor is believed to be caused by interdiffusion at the interfaces between the Cu spacer layer and the adjacent magnetic layers. Stability against Cu interdiffusion is a prerequisite for the use of Ni—Mn as the AFM layer in a SV sensor because the SV sensor must survive the severe heat treatment required to anneal the Ni—Mn.

Therefore there is a need for a SV sensor using a Ni—Mn AFM pinning layer that can withstand the annealing step required to achieve the desired exchange coupling without the undesirable degradation of the SV effect.

SUMMARY OF THE INVENTION

It is an object of the present invention to disclose an improved seed layer for SV sensors with the film structure Seed/Free/Spacer/Pinned/AFM/Cap wherein the improved seed layer results in enhanced GMR effect and improved thermal stability.

It is another object of the present invention to disclose an SV sensor having an improved seed layer which allows the use of a Ni—Mn AFM layer as the pinning layer.

It is a further object of the present invention to disclose an improved SV sensor having the film structure Ni—Fe—Cr/ Ni—Fe/Cu/Co/Ni—Mn/Cap wherein the annealing step to develop exchange coupling is carried out without degradation of the GMR effect.

It is yet another object of the present invention to disclose a process for optimizing the Ni—Fe—Cr seed layer thickness for fabrication of SV sensors with the film structure Ni—Fe—Cr/Ni—Fe/Cu/Co/Ni—Mn/Cap.

In accordance with the principles of the present invention there is disclosed an SV sensor with the preferred structure of Substrate/Ni—Fe—Cr/Ni—Fe/Cu/Co/Ni—Mn/Cap. The Ni—Fe—Cr seed layer alters the grain structure of the subsequent layers deposited over said seed layer resulting in improved GMR effect and improved thermal stability of the SV sensor. The layers deposited over the Ni—Fe—Cr seed layer have significantly larger grain structures than are obtained with a tantalum (Ta) seed layer. The larger grain structures of the SV sensor layers are thought to be less susceptible to interdiffusion at interfaces between adjoining layers.

The above as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
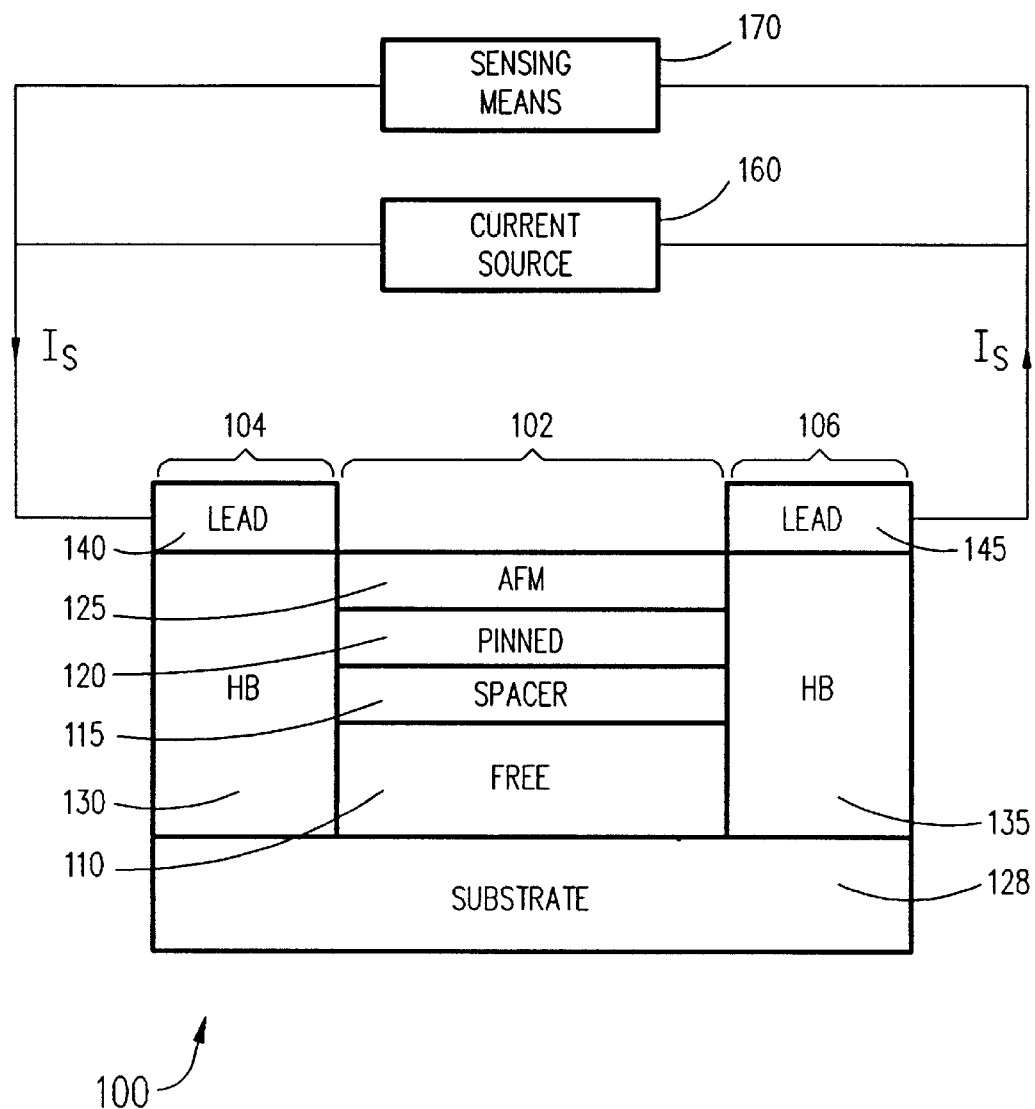
FIG. 1 is an air bearing surface view of a prior art SV sensor.
Figure 2:
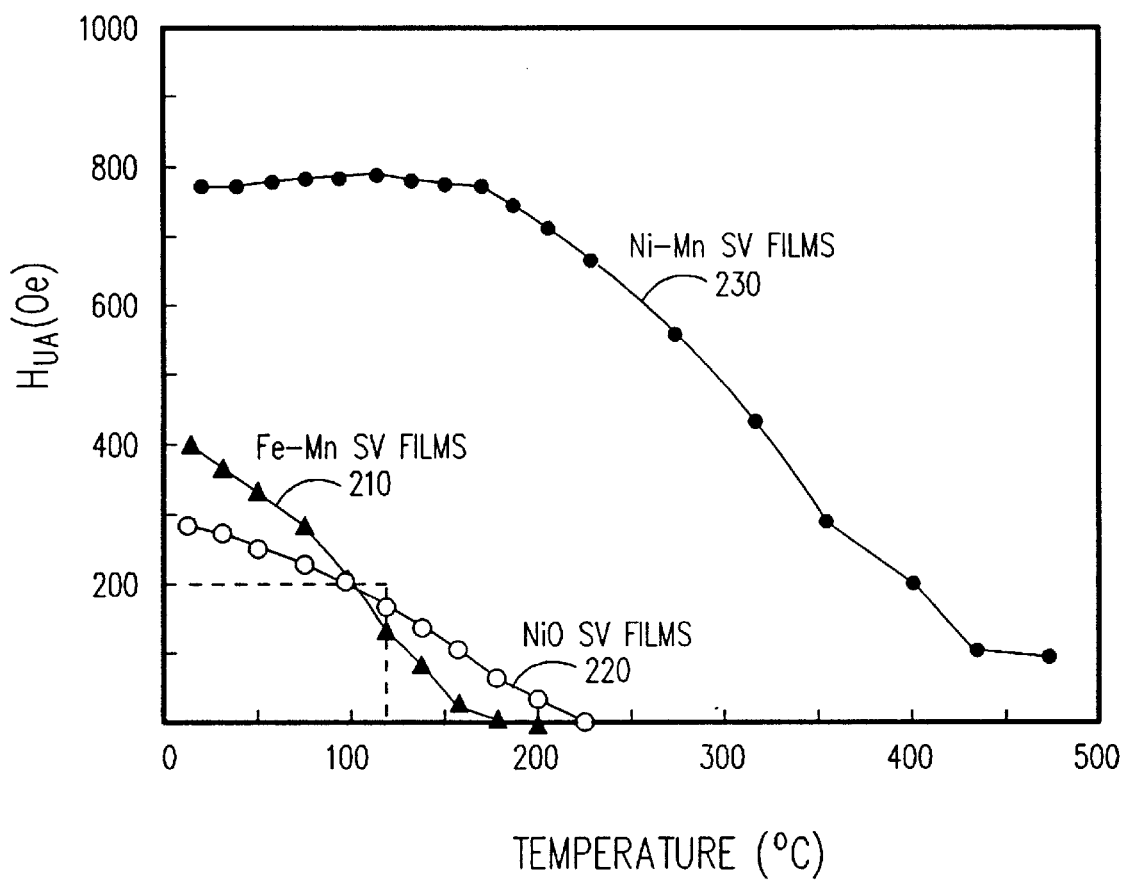
FIG. 2 is a graph showing temperature dependence of the pinning fields for exchange coupling of Fe—Mn, NiO and Ni—Mn antiferromagnetic pinning layers to Ni—Fe ferromagnetic pinned layers.
Figure 3:
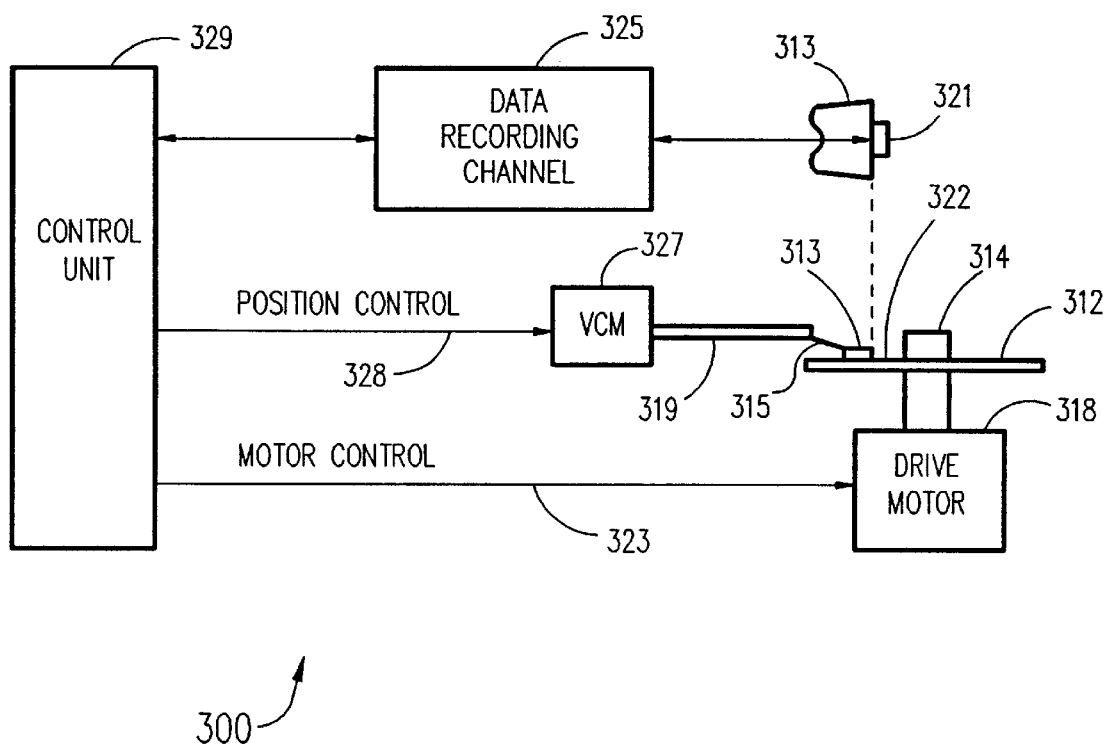
FIG. 3 is a simplified drawing of a magnetic recording disk drive system incorporating the SV sensor of the present invention.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321 where the head 321 incorporates the MR sensor of the present invention. As the disks rotate, slider 313 is moved radially in and out over disk surface 322 so that heads 321 may access different portions of the disk where desired data is recorded. Each slider 313 is attached to an actuator arm 319 by means of a suspension 315. The suspension 315 provides a slight spring force which biases slider 313 against the disk surface 322. Each actuator arm 319 is attached to an actuator means 327. The actuator means as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 (the surface of slider 313 which includes head 321 and faces the surface of disk 312 is referred to as an air bearing surface (ABS)) and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by means of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
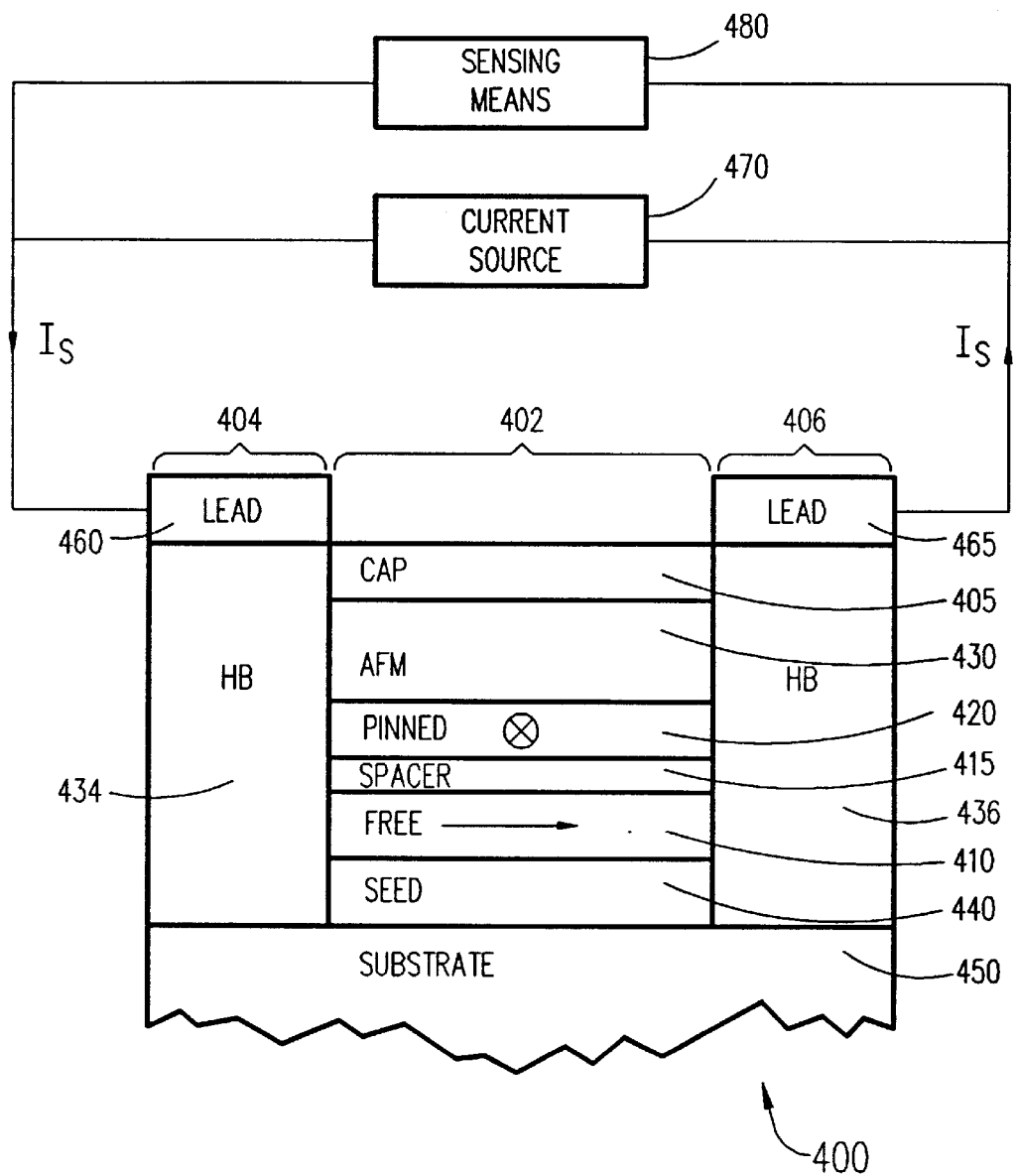
FIG. 4 is an air bearing surface view of the SV sensor of the present invention.

FIG. 4 shows an air bearing surface (ABS) view of the SV sensor 400 according to the preferred embodiment of the present invention. SV sensor 400 comprises end regions 404 and 406 separated by a central region 402. The substrate 450 can be any suitable substance, including glass, semiconductor material, or a ceramic material, such as alumina ($Al_2O_3$). The seed layer 440 is a layer deposited to modify the crystallographic texture or grain size of the subsequent layers. In previous SV structures, the seed layer material commonly used is tantalum (Ta). In the present invention, an improved seed layer 440 is formed of Ni—Fe (or Ni), mixed with enough chromium (Cr) to make the resulting alloy non-magnetic. A free layer (free ferromagnetic layer) 410, deposited on the seed layer 440, is separated from a pinned layer (pinned ferromagnetic layer) 420 by a non-magnetic spacer layer 415. In the preferred embodiment of the present invention, spacer layer 415 is also an electrically conducting spacer layer. Free layer 410 may be made of a single layer of ferromagnetic material or it may be made of a first and second free sub-layers of different ferromagnetic materials where the second sub-layer is formed over the seed layer 440 and the first sub-layer is formed in contact with the spacer layer 415. The magnetization of the pinned layer 420 is fixed by an antiferromagnetic (AFM) layer 430. A cap layer 405 deposited on the AFM layer 430 completes the central region 402 of the SV sensor 400.

Referring to FIG. 4, the SV sensor 400 further comprises layers 434 and 436 formed on the end regions 404 and 406, respectively, for providing a longitudinal bias field to the free layer 410 to ensure a single magnetic domain state in the free layer. Lead layers 460 and 465 are also deposited on the end regions 404 and 406, respectively, to provide electrical connections for the flow of the sensing current $I_S$ from a current source 470 to the SV sensor 400. Sensing means 480 connected to leads 460 and 465 sense the change in the resistance due to changes induced in the free layer 410 by the external magnetic field (e.g., field generated by a data bit stored on a disk). Sensing means 480 includes a digital or analog recording channel. In the preferred embodiment of the present invention, sensing means 480 includes a recording channel known as partial-response maximum-likelihood (PRML) recording channel. Design and implementation of the PRML recording channels are well known to those skilled in the art.

The SV sensor of the present invention is fabricated using sputtering methods known in the art (ion beam, R-F diode, magnetron or DC magnetron sputtering) to sequentially deposit the layers of SV sensor 400 shown in FIG. 4. The sputter deposition process for fabrication of SV sensor 400 is started with deposition on a substrate 450 of a seed layer 440 having a thickness of about 40 Å. Seed layer 440 is formed of an alloy Ni—Fe—Cr, or alternatively Ni—Cr, having sufficient chromium (Cr) content to make the alloy non-magnetic. In the preferred embodiment of this invention, the composition of the seed layer in atomic percent is 60% ($Ni_{80}$—$Fe_{20}$) and 40% Cr. Alternatively, the Ni—Fe—Cr alloy composition in atomic percent may be expressed as:

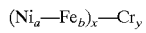

where
a+b=100%, 45%<a<100%, 0%<b<55%, and
x+y=100%, 50%<x<80%, 20%<y<50%.

Free layer 410 formed of a permalloy (Ni—Fe) film having a thickness of about 55 Å is deposited on and in contact with seed layer 440. Alternatively, free layer 410 may be formed as a laminated structure comprising a Ni—Fe layer having a thickness of about 45 Å deposited on and in contact with seed layer 440 and a cobalt (Co) layer having a thickness of about 6 Å deposited on and in contact with the Ni—Fe layer. Spacer layer 415 formed of a copper (Cu) film having a thickness of about 24 Å is deposited on and in contact with the free layer 410. Pinned layer 420 formed of a cobalt (Co) film having a thickness of about 30 Å is deposited on and in contact with the spacer layer 415. AFM layer 430 formed of a Ni—Mn film having a thickness of about 300 Å is deposited on and in contact with the pinned layer 420. The preferred composition of the Ni—Mn AFM layer is a Mn composition in the range between 46 and 60 atomic percent. Cap layer 405 formed of a suitable protective material such as Ta, Ni—Fe—Cr or $Al_2O_3$ completes the structure of the central portion 402 of the SV sensor 400.

The as-deposited Ni—Mn AFM layer 430 does not show significant exchange coupling to pinned layer 420. To develop the desired exchange coupling, SV sensor 400 is thermally annealed at a temperature of 280 C. for 4 hours. Annealing conditions used to develop exchange coupling can be varied from about 240 C. for greater than 8 hours to 320 C. for greater than 0.2 hours. In the present invention, the use of Ni—Fe—Cr as the seed layer for SV sensor 400 results in a Ni—Fe free layer grain structure with grains four to five times larger than obtained for free layer deposition on a Ta seed layer. The increased grain size of the free layer 410 also results in a larger grain structure of the subsequently deposited layers comprising SV sensor 400. Since in thin films most of the diffusion at temperatures below 300 C. occurs at grain boundaries, therefore it is postulated that the reduced number of grain boundaries resulting from the larger grain structure inhibits interdiffusion. After the annealing process at 280 C. for 4 hours to set the Ni—Mn AFM layer exchange coupling with the pinned layer, the SV sensors have GMR coefficients, deltaR/R, as high as 7.7%, an improvement of 70% over comparable SV sensors fabricated by the same process but with a Ta seed layer.

In the preferred embodiment of the invention, SV sensors may be formed with the alternate free layer 410 comprising laminated Ni—Fe and Co layers. In this structure, the laminated free layer 410 comprises a Ni—Fe layer (second sub-layer) having a thickness of about 45 Å and a Co layer (first sub-layer) having a thickness of about 6 Å. The magnetic thickness of this laminated free layer structure is equivalent to the magnetic thickness of the 55 Å thick Ni—Fe free layer used in the embodiment described above. After annealing at 280 C. for 4 hours, GMR coefficients of 10.5% were obtained for SV sensors having the laminated Ni—Fe/Co free layer structure.

Figure 5:
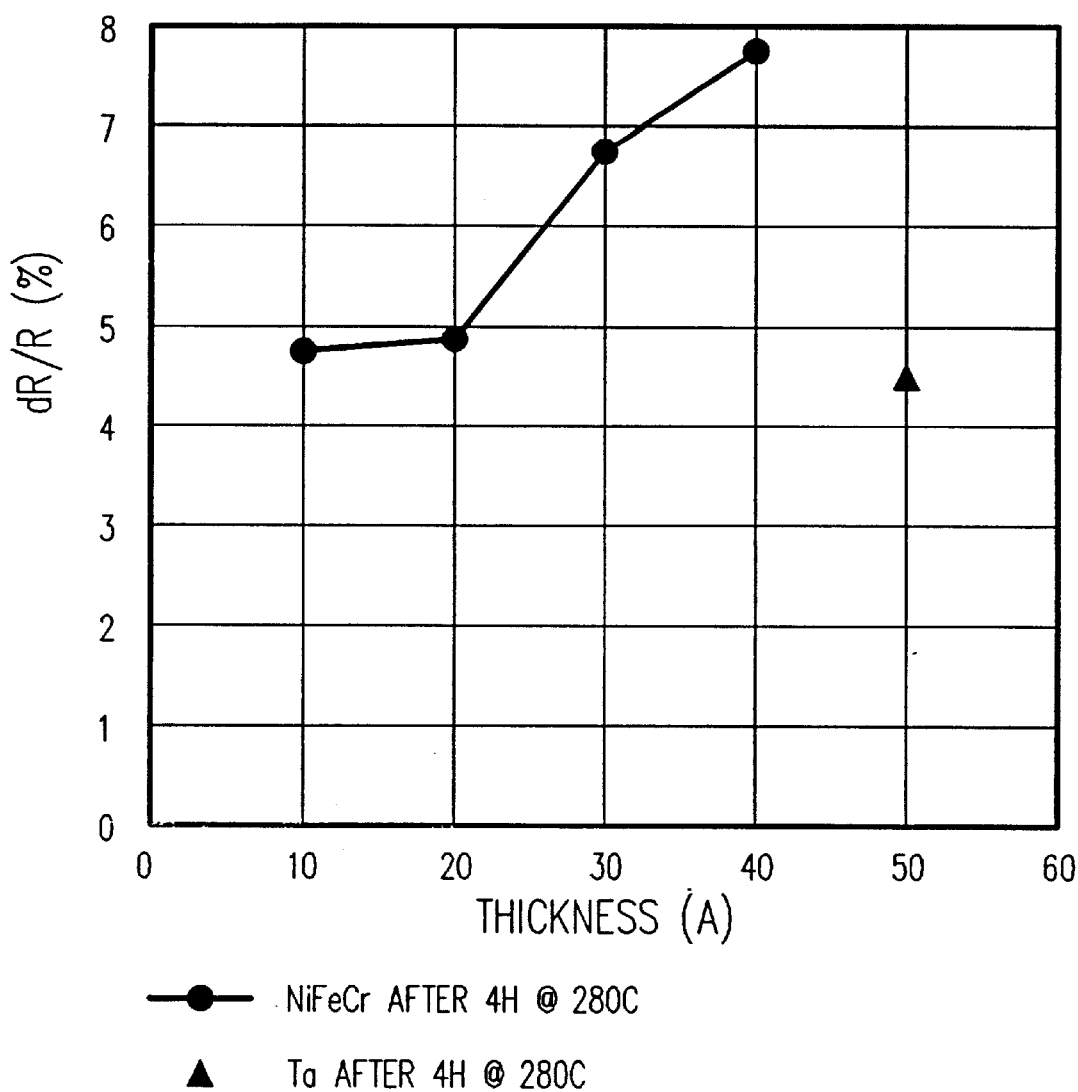
FIG. 5 is a graph showing the GMR coefficient (deltaR/R) as a function of Ni—Fe—Cr seed layer thickness for an SV sensor with Ni—Mn AFM layer.

FIG. 5 is a graph showing the effect of seed layer thickness on the GMR coefficient for SV sensors with Ni—Fe—Cr seed layers and Ni—Mn AFM layers. The data is shown for SV sensors after annealing at 280 C. for 4 hours. The GMR coefficient increases with thickness of the Ni—Fe—Cr seed layer, reaching a maximum value of 7.7% at about 40 to 50 Å. The GMR coefficient of a comparable SV sensor fabricated with a 50 Å thick Ta seed layer is 4.5%.

The Ni—Fe—Cr seed layer of the present invention makes it possible to use Ni—Mn as the AFM layer for pinning without suffering degradation of the SV sensor GMR coefficient. The improved pinning provided by Ni—Mn is evident from measurements of the pinning reversal field (sum of pinning field and the coercive field, $H_c$). For the Ni—Mn AFM SV sensors of this invention the pinning reversal field is about 1100 Oe (for Ni—Fe—Cr seed layer thickness between 20 Å and 50 Å). This high exchange pinning field together with the high blocking temperature (about 450 C.) of Ni—Mn AFM layers prevents any pinned layer rotation from degrading SV sensor efficiency even at operating temperatures exceeding 120 C. For comparison, the pinning reversal field of Fe—Mn AFM SV sensors is only about 300 Oe and the blocking temperature is about 180 C. With the Fe—Mn AFM SV sensors, significant pinned layer rotation can occur due to diminished exchange pinning at temperatures above 120 C.

The improved temperature stability of the Ni—Mn AFM SV sensors of the present invention has the added advantage over previous SV sensors that higher values of the sense current $I_S$ can be applied across the sensor resulting in larger signals measured by the sensing means as SV sensor resistance changes in response to applied magnetic fields. The ability to operate SV sensors at higher sensitivities afforded by higher sense current without signal degradation due to the accompanying temperature increase can be a significant advantage as SV sensors become smaller in high data density applications.

While the preferred embodiment of the present invention provides the greatest improvement in SV sensor thermal stability, it will be apparent to those skilled in the art that the use of a Ni—Fe—Cr seed layer can improve the GMR coefficient and the thermal stability of SV sensors using other AFM layer materials. The present inventors have fabricated SV sensors with Fe—Mn AFM layers using the Ni—Fe—Cr seed layer and having the general structure Seed/Free/Spacer/Pinned/AFM/Cap. With the Fe—Mn AFM layer, exchange coupling to the pinned layer is present in the as-deposited state without requiring an annealing process. With an optimized seed layer thickness of about 50 Å, the GMR coefficient is about 8.5% which is an improvement by 40% over the GMR coefficient obtained for the same structure fabricated with a Ta seed layer 50 Å thick. The thermal stability of the GMR coefficient for an SV sensor having the Ni—Fe—Cr seed layer of the present invention is also improved compared to the Ta seed layer SV sensors. After a 280 C. anneal for 4 hours, the Ni—Fe—Cr seed layer (50 Å thick) SV sensor GMR coefficient degraded by only 2% compared to 45% degradation for the Ta seed layer (50 Å thick) SV sensors. However, unlike the results for the Ni—Mn AFM SV sensors, with the Fe—Mn AFM SV sensors the pinned layer reversal field decreases as the seed layer thickness is increased and degrades further with annealing at 280 C. for 4 hours.

Experiments by the present inventors have shown that optimal thickness of the Ni—Fe—Cr seed layer for the preferred embodiment is different for different sputter deposition systems. It is believed that the improved grain structure of the deposited layers comprising the SV sensors can vary to some degree depending on exact conditions in each deposition system. Because of this variability, an optimization procedure must be followed to determine the Ni—Fe—Cr seed layer thickness that results in the best SV sensor performance for the particular ion beam deposition system being used. The preferred procedure is to carry out a series of SV sensor depositions using a range of seed layer thicknesses and keeping all other parameters constant. A suitable thickness range for the seed layer thicknesses is 10 Å to 100 Å. After a 280 C. anneal for 4 hours, the GMR coefficients and exchange coupling parameters are measured by methods well known in the art and optimal seed layer thickness is determined.

Figure 6:
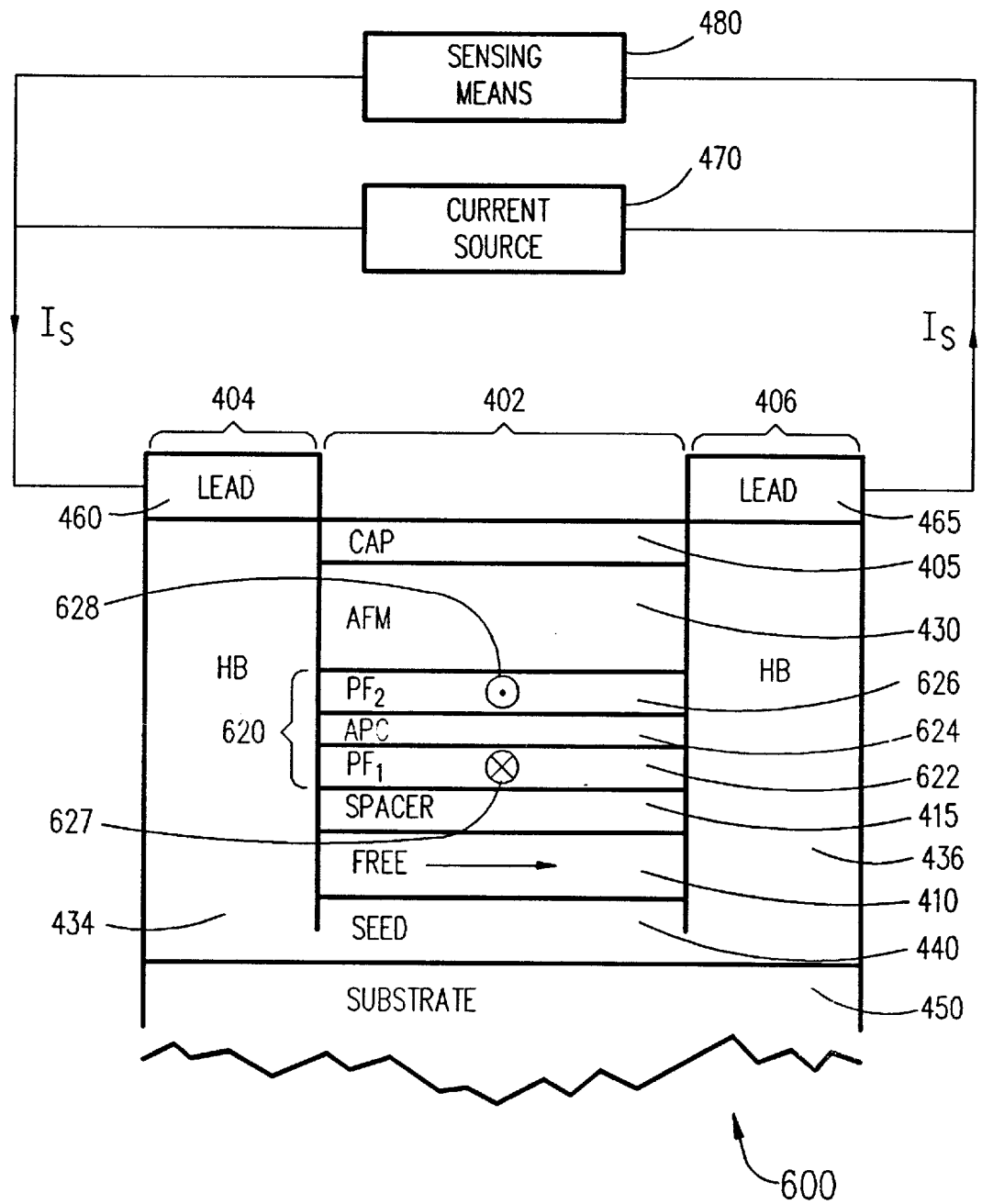
FIG. 6 is an air bearing surface view of an alternative embodiment of an SV sensor of the present invention.

FIG. 6 shows an air bearing surface (ABS) view of SV sensor 600 according to an alternative embodiment of the present invention similar to the SV sensor 400 wherein the pinned layer 420 of the SV sensor 400 is replaced by a laminated antiparallel-pinned (AP-pinned) layer 620. The $PF_1/APC/PF_2$ laminated AP-pinned layer 620 is formed on spacer layer 415. The laminated AP-pinned layer 620 comprises a first ferromagnetic pinned layer 622 ($PF_1$) and a second ferromagnetic pinned layer 626 ($PF_2$) separated from each other by an antiparallel coupling (APC) layer 624 of non-magnetic material that allows $PF_1$ and $PF_2$ to be strongly coupled together antiferromagnetically. The two pinned layers $PF_1$, $PF_2$ in the laminated AP-pinned layer structure 620 have their magnetizations directions oriented antiparallel, as indicated by arrows 627 and 628 (arrow heads pointing in and out of the plane of the paper). The antiparallel alignment of the magnetizations of the two ferromagnetic layers $PF_1$, $PF_2$ is due to an antiferromagnetic exchange coupling through the APC layer 624. The APC layer 624 is preferably made of ruthenium (Ru) although it may also be made of iridium (Ir) or rhodium (Rh). AFM layer 430 is deposited on and in contact with the second ferromagnetic layer 626 ($PF_2$). In the formation of SV sensor 600, the use of the Ni—Fe—Cr material of the present invention for seed layer 440 will improve the grain structure of the deposited films resulting in improved GMR coefficient and thermal stability.

It will be apparent to those skilled in the art that alternative AFM layer 430 materials such as Fe—Mn, Pd—Mn, Pt—Mn, Pd—Pt—Mn, Ir—Mn, Rh—Mn, Cr—Mn—Pt and Ru—Mn may also be used to fabricate SV sensors according to the present invention.

It will also be apparent to those skilled in the art that alternative non-magnetic spacer layer 415 materials such as gold and silver may also be used to fabricate SV sensors according to the present invention.

It will be further apparent to those skilled in the art that alternative pinned layer 420 materials such as permalloy (Ni—Fe) and laminated multilayer films such as Ni—Fe/Co may be used to fabricate SV sensors according to the present invention.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited in scope only as specified in the appended claims.

We claim:

1. A spin-valve (SV) magnetoresistive sensor, comprising:
   a seed layer of non-magnetic alloy of Ni—Fe—Cr deposited on a substrate;
   a free layer of ferromagnetic material deposited over said seed layer;
   a spacer layer of non-magnetic material deposited over said free layer;
   a pinned layer of ferromagnetic material deposited over said spacer layer; and
   antiferromagnetic (AFM) layer deposited over said pinned layer for pinning the magnetization of said pinned layer.

2. The SV sensor as recited in claim 1, wherein said free layer includes first and second free sub-layers where said first free sub-layer is made of a ferromagnetic material which is different from said second free sub-layer ferromagnetic material.

3. The SV sensor as recited in claim 2, wherein said first free sub-layer is made of cobalt and said second sub-layer is made of Ni—Fe.

4. The SV sensor as recited in claim 1, wherein said spacer layer is selected from a group of material consisting of copper, gold and silver.

5. The SV sensor as recited in claim 1, wherein said AFM layer is made of Ni—Mn.

6. The SV sensor as recited in claim 1, wherein said AFM layer is selected from a group of material consisting of Fe—Mn, Pd—Mn, Pt—Mn, Pd—Pt—Mn, Ir—Mn, Rh—Mn, Cr—Mn—Pt and Ru—Mn.

7. A spin-valve (SV) magnetoresistive sensor, comprising:
   a seed layer of non-magnetic alloy of Ni—Cr deposited on a substrate;
   a free layer of ferromagnetic material deposited over said seed layer;
   a spacer layer of non-magnetic material deposited over said free layer;
   a pinned layer of ferromagnetic material deposited over said spacer layer; and
   antiferromagnetic (AFM) layer deposited over said pinned layer for pinning the magnetization of said pinned layer.

8. The SV sensor as recited in claim 7, wherein said free layer includes first and second free sub-layers where said first free sub-layer is made of a ferromagneic material which is different from said second free sub-layer ferromagnetic material.

9. The SV sensor as recited in claim 8, wherein said first free sub-layer is made of cobalt and said second sub-layer is made of Ni—Fe.

10. The SV sensor as recited in claim 7, wherein said spacer layer is selected from a group of material consisting of copper, gold and silver.

11. The SV sensor as recited in claim 7, wherein said AFM layer is made of Ni—Mn.

12. The SV sensor as recited in claim 7, wherein said AFM layer is selected from a group of material consisting of Fe—Mn, Pd—Mn, Pt—Mn, Pd—Pt—Mn, Ir—Mn, Rh—Mn, Cr-MN-Pt and Ru—Mn.

13. A disk drive system, comprising:
a magnetic recording disk;
a spin valve (SV) magnetoresistive sensor for sensing magnetically recorded data on said disk, the SV sensor comprising:
a seed layer of non-magnetic alloy of Ni—Fe—Cr deposited on a substrate;
a free layer of ferromagnetic material deposited over said seed layer;
a spacer layer of non-magnetic material deposited over said free layer;
a pinned layer of ferromagnetic material deposited over said spacer layer; and
an antiferromagnetic (AFM) layer deposited over said pinned layer for pinning the magnetization of said pinned layer;
an actuator for moving said SV sensor across the magnetic recording disk so the SV sensor may access different regions of magnetically recorded data on the magnetic recording disk; and
a recording channel coupled electrically to the SV sensor for detecting changes in resistance of the SV sensor caused by rotation of the magnetization axis of the free ferromagnetic layer relative to the fixed magnetization of the pinned layer in response to magnetic fields from the magnetically recorded data.

14. The disk drive system as recited in claim 13, wherein said free layer includes a first and a second free sub-layer where said first free sub-layer is made of a ferromagneic material which is different than said second free sub-layer ferromagnetic material.

15. The disk drive system as recited in claim 14, wherein said first free sub-layer is made of cobalt and said second sub-layer is made of Ni—Fe.

16. The disk drive system as recited in claim 13, wherein said spacer layer is selected from a group of material consisting of copper, gold and silver.

17. The disk drive system as recited in claim 13, wherein said AFM layer is made of Ni—Mn.

18. The disk drive system as recited in claim 13, wherein said AFM layer is selected from a group of material consisting of Fe—Mn, Pd—Mn, Pt—Mn, Pd—Pt—Mn, Ir—Mn, Rh—Mn, Cr—Mn—Pt and Ru—Mn.

19. A disk drive system, comprising:
a magnetic recording disk;
a spin valve (SV) magnetoresistive sensor for sensing magnetically recorded data on said disk, the SV sensor comprising:
a seed layer of non-magnetic alloy of Ni—Cr deposited on a substrate;
a free layer of ferromagnetic material deposited over said seed layer;
a spacer layer of non-magnetic material deposited over said free layer;
a pinned layer of ferromagnetic material deposited over said spacer layer; and
an antiferromagnetic (AFM) layer deposited over said pinned layer for pinning the magnetization of said pinned layer;
an actuator for moving said SV sensor across the magnetic recording disk so the SV sensor may access different regions of magnetically recorded data on the magnetic recording disk; and
a recording channel coupled electrically to the SV sensor for detecting changes in resistance of the SV sensor caused by rotation of the magnetization axis of the free ferromagnetic layer relative to the fixed magnetization of the pinned layer in response to magnetic fields from the magnetically recorded data.

20. The disk drive system as recited in claim 19, wherein said free layer includes a first and a second free sub-layer where said first free sub-layer is made of a ferromagnetic material which is different than said second free sub-layer ferromagnetic material.

21. The disk drive system as recited in claim 20, wherein said first free sub-layer is made of cobalt and said second sub-layer is made of Ni—Fe.

22. The disk drive system as recited in claim 19, wherein said spacer layer is selected from a group of material consisting of copper, gold and silver.

23. The disk drive system as recited in claim 19, wherein said AFM layer is made of Ni—Mn.

24. The disk drive system as recited in claim 19, wherein said AFM layer is selected from a group of material consisting of Fe—Mn, Pd—Mn, Pt—Mn, Pd—Pt—Mn, Ir—Mn, Rh—Mn and Ru—Mn.

25. A spin valve (SV) magnetoresistive sensor, comprising:
a seed layer deposited on a substrate, wherein said seed layer is made of a non-magnetic alloy of $(Ni_a—Fe_b)_x—Cr_y$ where 45% >a>100%, 0%>b>55%, 50%>x>80%, 20%>y>50%, a+b=100%, and x+y=100%;
a free layer of ferromagnetic material deposited over said seed layer;
a spacer layer of non-magnetic material deposited over said free layer;
a pinned layer of ferromagnetic material deposited over said spacer layer; and
an antiferromagnetic (AFM) layer deposited over said pinned layer for pinning the magnetization of said pinned layer.

26. A spin valve (SV) magnetoresistive sensor, comprising:
a seed layer deposited on a substrate, wherein said seed layer is made of a non-magnetic alloy of $Ni_x—Cr_y$ where 50%>x>80%, 20%>y>50%, and x+y=100%;
a free layer of ferromagnetic material deposited over said seed layer;
a spacer layer of non-magnetic material deposited over said free layer;
a pinned layer of ferromagnetic material deposited over said spacer layer; and
an antiferromagnetic (AFM) layer deposited over said pinned layer for pinning the magnetization of said pinned layer.

* * * * *